US008399885B2

(12) United States Patent
Shin

(10) Patent No.: US 8,399,885 B2
(45) Date of Patent: Mar. 19, 2013

(54) THIN FILM TRANSISTOR SUBSTRATE AND FLAT PANEL DISPLAY APPARATUS

(75) Inventor: Kwang-Sub Shin, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 141 days.

(21) Appl. No.: 13/099,106

(22) Filed: May 2, 2011

(65) Prior Publication Data

US 2012/0049192 A1 Mar. 1, 2012

(30) Foreign Application Priority Data

Aug. 26, 2010 (KR) .................. 10-2010-0083061

(51) Int. Cl.
*H01L 29/786* (2006.01)
(52) U.S. Cl. .................. 257/59; 257/E29.273
(58) Field of Classification Search .................. None
See application file for complete search history.

(56) References Cited

U.S. PATENT DOCUMENTS

| 6,469,318 B2* | 10/2002 | Yamada et al. .............. 257/59 |
| 6,670,638 B2 | 12/2003 | Tamura et al. |
| 6,858,512 B2 | 2/2005 | Morimoto et al. |
| 7,160,763 B2* | 1/2007 | Im et al. .................. 438/150 |
| 7,229,860 B2 | 6/2007 | Song et al. |
| 7,259,081 B2* | 8/2007 | Im .................. 438/487 |
| 7,740,993 B2* | 6/2010 | Sun .................. 430/5 |
| 7,888,679 B2* | 2/2011 | Park .................. 257/72 |
| 8,106,409 B2* | 1/2012 | Kim et al. .................. 257/88 |
| 2003/0119286 A1* | 6/2003 | Im et al. .................. 438/487 |
| 2004/0245526 A1* | 12/2004 | Park et al. .................. 257/72 |
| 2005/0012152 A1* | 1/2005 | Park et al. .................. 257/347 |
| 2005/0062047 A1* | 3/2005 | Nishikawa et al. ............. 257/72 |
| 2005/0139830 A1* | 6/2005 | Takeda et al. .................. 257/66 |
| 2005/0142897 A1* | 6/2005 | Kim et al. .................. 438/795 |
| 2005/0235903 A1* | 10/2005 | Im et al. .................. 117/4 |
| 2006/0003506 A1* | 1/2006 | You .................. 438/166 |
| 2006/0152644 A1* | 7/2006 | Yi .................. 349/42 |
| 2006/0157711 A1* | 7/2006 | Kang .................. 257/72 |
| 2006/0254497 A1* | 11/2006 | Takeda et al. .................. 117/7 |
| 2007/0015066 A1* | 1/2007 | Sun .................. 430/5 |
| 2007/0048978 A1* | 3/2007 | Sun .................. 438/486 |
| 2007/0114534 A1* | 5/2007 | Park et al. .................. 257/64 |

(Continued)

FOREIGN PATENT DOCUMENTS

| JP | 2008096962 | 4/2008 |
| KR | 1020020010455 A | 2/2002 |
| KR | 1020060001745 A | 1/2006 |

(Continued)

*Primary Examiner* — Thomas L Dickey
*Assistant Examiner* — Joseph Schoenholtz
(74) *Attorney, Agent, or Firm* — Robert E. Bushnell, Esq.

(57) ABSTRACT

A thin film transistor substrate including a plurality of thin film transistors, and a flat panel display apparatus. Each of the plurality of thin film transistors includes an active layer comprising a first channel region having a first plurality of protrusion lines arranged therein and a second channel region and having a second plurality of protrusion lines arranged therein, a source electrode and a drain electrode electrically connected to the active layer and a gate electrode insulated from the active layer, wherein the first and second plurality of protrusion lines extend in a first direction, wherein a edges of the first channel region that extend in the first direction and are offset sideways by a distance in a second direction that is orthogonal to the first direction from corresponding edges of the second channel region that extend in the first direction.

20 Claims, 2 Drawing Sheets

U.S. PATENT DOCUMENTS

| | | |
|---|---|---|
| 2007/0158734 A1 | 7/2007 | Chindalore |
| 2007/0187676 A1* | 8/2007 | Park et al. .................. 257/40 |
| 2007/0196743 A1* | 8/2007 | Chu et al. .................... 430/5 |
| 2008/0030877 A1* | 2/2008 | Turk et al. .................. 359/719 |
| 2008/0067519 A1 | 3/2008 | Sakurai et al. |
| 2008/0224143 A1* | 9/2008 | Kim et al. .................. 257/59 |
| 2009/0075436 A1* | 3/2009 | Heo et al. .................. 438/150 |
| 2009/0121231 A1* | 5/2009 | Kim et al. .................. 257/64 |
| 2009/0134394 A1* | 5/2009 | Azuma et al. .................. 257/66 |
| 2009/0203230 A1* | 8/2009 | Park .................. 438/795 |
| 2009/0263978 A1* | 10/2009 | Seo et al. .................. 438/795 |
| 2010/0019243 A1* | 1/2010 | Sun et al. .................. 257/59 |
| 2010/0068841 A1* | 3/2010 | Park et al. .................. 438/30 |
| 2010/0129970 A1* | 5/2010 | Kim .................. 438/166 |
| 2011/0108843 A1* | 5/2011 | Im et al. .................. 257/64 |

FOREIGN PATENT DOCUMENTS

KR   1020080083137 A   9/2008

* cited by examiner

20 # THIN FILM TRANSISTOR SUBSTRATE AND FLAT PANEL DISPLAY APPARATUS

CLAIM OF PRIORITY

This application makes reference to, incorporates the same herein, and claims all benefits accruing under 35 U.S.C. §119 from an application for a THIN FILM TRANSISTOR SUBSTRATE AND FLAT PANEL DISPLAY APPARATUS earlier filed in the Korean Intellectual Property Office on 26 Aug. 2010 and there duly assigned Serial No. 10-2010-0083061.

BACKGROUND OF THE INVENTION

1. Field of the Invention

The present invention relates to a thin film transistor substrate and a flat panel display apparatus that has uniform electrical characteristics and uniform display characteristics.

2. Description of the Related Art

Recently, many existing display apparatuses are replaced by flat panel display apparatuses that are portable and thin. Of among flat panel display apparatuses, liquid crystal display apparatuses and organic light-emitting display apparatuses appeal most to people because of their excellent image quality and their portability.

Meanwhile, such flat panel display apparatuses include a thin film transistor substrate including a plurality of thin film transistors for driving or controlling pixels. Each of the thin film transistors includes a channel region that is made out of crystalline silicon that has excellent electrical characteristics.

Crystalline silicon may be produced by emitting a laser beam onto amorphous silicon to crystallize the amorphous silicon. During the crystallization process, protrusions are formed on a surface of the crystalline silicon. In particular, when the crystallization process is performed by sequential lateral solidification (SLS), crystals growing in two directions meet to form protrusions.

The protrusions interrupt the flow of current, thereby degrading the electrical characteristics of each of the thin film transistors. Also, the protrusions irregularly distributed on the channel region degrade the uniform electrical characteristics of the thin film transistor substrate, thereby degrading the image quality characteristics of the flat panel display apparatus.

SUMMARY OF THE INVENTION

The present invention provides a thin film transistor substrate and a flat panel display apparatus which easily provide uniform electrical characteristics and uniform display characteristics.

According to an aspect of the present invention, there is provided a thin film transistor substrate including an active layer comprising a first channel region having a first plurality of protrusion lines arranged therein and a second channel region and having a second plurality of protrusion lines arranged therein, a source electrode and a drain electrode electrically connected to the active layer and a gate electrode insulated from the active layer, wherein the first and second plurality of protrusion lines extend in a first direction, wherein a edges of the first channel region that extend in the first direction and are offset sideways by a distance in a second direction that is orthogonal to the first direction from corresponding edges of the second channel region that extend in the first direction. The first plurality may be unequal to the second plurality. The first plurality may differ from the second plurality by 1. The first channel region and the second channel region may extend in the second direction. A length of the first channel region extending in the second direction may be equal to a length of the second channel region neighboring ones of the first plurality of protrusion lines and neighboring ones of the second plurality of protrusion lines are spaced apart from each other another at regular intervals extending in the second direction.

Neighboring ones of the first plurality of protrusion lines and neighboring ones of the second plurality of protrusion lines may be spaced apart from each other at regular intervals. The active layer may also include an intermediate region arranged between the first channel region and the second channel region and a source region and a drain region arranged on sides of the first channel region and the second channel region opposite from the intermediate region. Both edges of the intermediate region extending from the first channel region to the second channel region form an oblique angle with the first direction. The gate electrode may include a first gate electrode overlapping the first channel region and a second gate electrode overlapping the second channel region.

According to another aspect of the present invention, there is provided a flat panel display apparatus that includes a display device and a plurality of thin film transistors, each of the plurality of thin film transistors includes an active layer comprising a first channel region having a first plurality of protrusion lines arranged therein and a second channel region and having a second plurality of protrusion lines arranged therein, a source electrode and a drain electrode electrically connected to the active layer and a gate electrode insulated from the active layer, wherein the first and second plurality of protrusion lines extend in a first direction, wherein edges of the first channel region that extend in the first direction and are offset sideways by a distance in a second direction that is orthogonal to the first direction from corresponding edges of the second channel region that extend in the first direction. The first plurality may be unequal to the second plurality. The first plurality may differ from the second plurality by 1. The first channel region and the second channel region may extend in the second direction. A length of the first channel region extending in the second direction may be equal to a length of the second channel region neighboring ones of the first plurality of protrusion lines and neighboring ones of the second plurality of protrusion lines are spaced apart from each other another at regular intervals extending in the second direction.

Neighboring ones of the first plurality of protrusion lines and neighboring ones of the second plurality of protrusion lines may be spaced apart from each other at regular intervals. The active layer may also include an intermediate region arranged between the first channel region and the second channel region and a source region and a drain region arranged on sides of the first channel region and the second channel region opposite from the intermediate region. Both edges of the intermediate region extending from the first channel region to the second channel region form an oblique angle with the first direction. The gate electrode may include a first gate electrode overlapping the first channel region and a second gate electrode overlapping the second channel region. The display device may be one of an organic light-emitting diode display device and a liquid crystal display device. The display device may be electrically connected to at least one of the plurality of thin film transistors.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
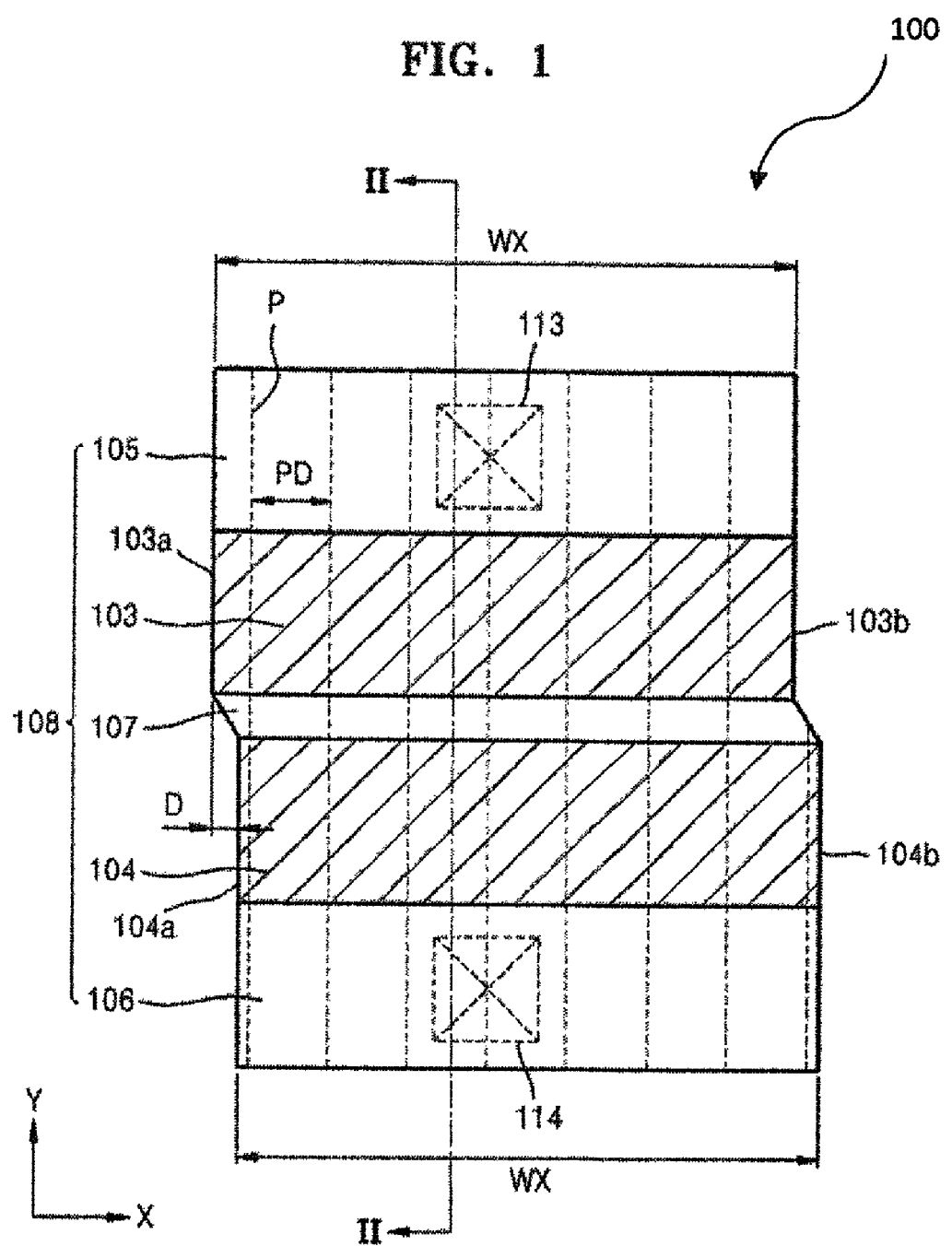
FIG. 1 is a plan view of a thin film transistor substrate according to an embodiment of the present invention.
Figure 2:
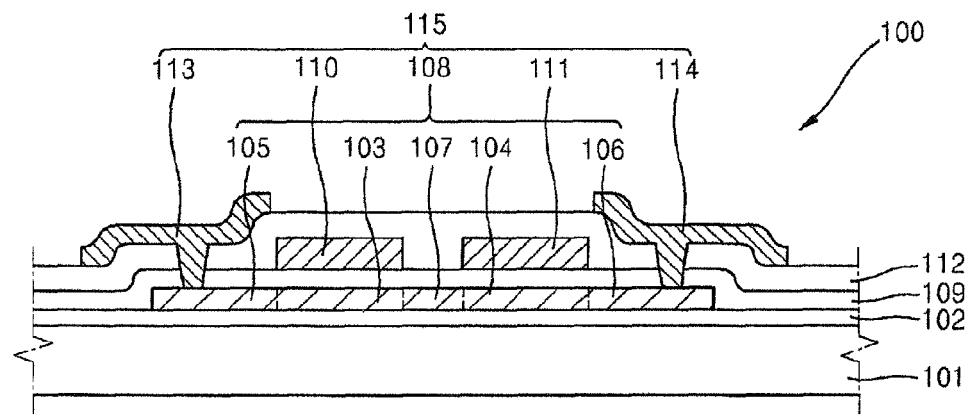
FIG. 2 is a cross-sectional view taken along line II-II of FIG. 1.

Turning now to FIGS. 1 and 2, FIG. 1 is a plan view of a thin film transistor substrate 100 according to an embodiment of the present invention and FIG. 2 is a cross-sectional view taken along line II-II of FIG. 1. Referring to FIGS. 1 and 2, the thin film transistor substrate 100 includes a plurality of thin film transistors arranged on a substrate 101, however for convenience of explanation, only one thin film transistor 115 is illustrated in FIGS. 1 and 2.

Specifically, the substrate 101 may be a transparent glass material including $SiO_2$ as a main component, however the present embodiment is not limited thereto, as the substrate 101 may instead be made out of a transparent plastic material. If the substrate 101 is made out of a transparent plastic material, the transparent plastic material may be an organic insulating material such as polyether sulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), or cellulose acetate propionate (CAP). Alternatively, the substrate 101 may instead be made out of a metal.

In order to planarize a top surface of the substrate 101 and prevent foreign substances from penetrating into the substrate 101, a buffer layer 102 may be formed on the top surface of the substrate 101. The buffer layer 102 may include $SiO_2$ or $SiN_x$.

The thin film transistor 115 is formed on the buffer layer 102. The thin film transistor 115 includes an active layer 108, a first gate electrode 110, a second gate electrode 111, a source electrode 113, and a drain electrode 114.

The active layer 108 having a predetermined pattern is formed on the buffer layer 102 and is made out of crystalline silicon that is formed by crystallizing amorphous silicon by using sequential lateral solidification (SLS). Due to the crystallization process, a plurality of linear protrusion lines P are formed on a surface of the active layer 108 as shown in FIG. 2. The protrusion lines P are spaced apart from one another at regular intervals PD, and extend in a first direction, that being the Y direction of FIG. 1.

The active layer 108 includes a first channel region 103, a second channel region 104, a source region 105, a drain region 106, and an intermediate region 107. The first channel region 103 and the second channel region 104 are intrinsic regions into which conductive impurities are not doped. The source region 105 and the drain region 106 spaced apart from each other by the first channel region 103 and the second channel region 104 and are extrinsic regions that are doped with conductive impurities. The conductive impurities may be P-type impurities such as boron (B), or N-type impurities such as nitrogen (N).

The intermediate region 107 is also an extrinsic region doped with conductive impurities. The intermediate region 107 is a rhomboid, which is a parallelogram having interior angles that are oblique. In other words, the side edges of the intermediate region form an angle with the first direction (i.e., Y axis direction of FIG. 1) while edges which form a boundary with the first or the second channel regions 103 or 104 are parallel to the second direction (or X-axis direction of FIG. 1). Accordingly, the first channel region 103 and the second channel region 104 are shifted from one another by a distance D in the second direction (or X axis direction of FIG. 1).

The first channel region 103 and the second channel region 104 are spaced apart from each other. The first channel region 103 includes both edges 103a and 103b that extend in the first direction (Y axis direction). Specifically, the first channel region 103 includes a left edge 103a illustrated on the left of FIG. 1, and a right edge 103b illustrated on the right of FIG. 1. The second channel region 104 includes both edges 104a and 104b that extend in the first direction (Y axis direction). Specifically, the second channel region 104 includes a left edge 104a illustrated on the left of FIG. 1, and a right edge 104b illustrated on the right of FIG. 1. The first channel region 103 and the second channel region 104 have the same length WX that extends in the second direction (X-axis direction).

Both edges 103a and 103b of the first channel region 103 are shifted in the second direction (X-axis direction) from corresponding edges 104a and 104b respectively of the second channel region 104 by a distance D. Specifically, the left edge 103a of the first channel region 103a is displaced in the −X axis direction as compared to the left edge 104a of the second channel region 104 by distance D. That is, an extension line from the left edge 103a of the first channel region 103 that extends in the first direction (Y axis direction) runs parallel but is spaced-apart from the left edge 104a of the second channel region 104 by distance D. That is, a distance between the extension line from the left edge 103a of the first channel region 103 and the left edge 104a of the second channel region 104 may be a predetermined interval D.

Also, the right edge 103b of the first channel region 103 is shifted distance D in the −X axis direction (or second direction) from the right edge 104b of the second channel region 104. That is, an extension line from the right edge 103b and extending in the first direction runs parallel to but does not overlap the right edge 104b of the second channel region 104.

The protrusion lines P are formed on surfaces of the first channel region 103 and the second channel region 104 as shown in FIG. 1. The thin film transistor substrate 100 includes at least one thin film transistor 115 that includes the first channel region 103 and the second channel region 104 on which a differing number of protrusion lines P can be formed.

Specifically, 7 protrusion lines P are arranged within the first channel region 103 and 8 protrusion lines P are arranged within the second channel region 104 as shown in FIG. 1. Therefore, the thin film transistor substrate 100 of FIG. 1 includes at least one thin film transistor 115 having 7 protrusion lines P formed in the first channel region 103 and 8 protrusion lines P formed in the second channel region 104.

Although not shown, the thin film transistor substrate 100 of FIG. 1 may instead include the thin film transistor 115 having 7 protrusion lines P arranged within both the first channel region 103 and the second channel region 104. Alternatively, the thin film transistor substrate 100 of FIG. 1 may instead include the thin film transistor 115 having 8 protrusion lines P arranged within both the first channel region 103 and the second channel region 104.

The protrusion lines P arranged on the active layer 108 of the thin film transistor 115 affect the flow of current within the thin film transistor 115, and change the electrical characteristics of the thin film transistor 115. In particular, the protrusion lines P arranged within the active layer 108 of the thin film transistor 115 may also affect the flow of leakage current within the thin film transistor 115.

The characteristics of the thin film transistor 115 are changed according to the number of protrusion lines P arranged within the first channel region 103 and within the second channel region 104, which may affect the thin film transistor substrate 100 including a plurality of the thin film transistors 115.

In the thin film transistor substrate 100 of FIG. 1, the numbers of the protrusion lines P arranged on the first channel region 103 and the second channel region 104 may differ from each other due to the fact that the first channel region 103 is shifted with respect to the second channel region 104 in the second direction (X axis direction) by distance D. Accordingly, the number of the protrusion lines P arranged within the first channel region 103 and the second channel region 104 of the plurality of thin film transistor 115 included in the thin film transistor substrate 100 may differ from each other.

That is, when thin film transistors of a conventional thin film transistor substrate include first channel regions and second channel regions having the same length and disposed in parallel to one another, some transistors have 7 protrusion lines are arranged in both of the first channel region and second channel region while others thin film transistors have 8 protrusion lines arranged in both of the first channel region and second channel region. In this case, due to a difference between the numbers of the protrusion lines of different thin film transistors, a variation in electrical characteristics of the thin film transistors is high. Accordingly, since a difference between the electrical characteristics of thin film transistors within one display is high, the conventional thin film transistor substrate fails to provide uniform electrical characteristics.

In contrast, in the thin film transistor substrate 100 of the present invention, some of the thin film transistors 115 may have channel regions with differing numbers of protrusion lines P. That is, in the present invention, a single thin film transistor 115 may have a different number of protrusion lines P in the first channel region 103 than in the second channel region 104 where one of the channel regions includes 7 protrusions P and the other includes 8 protrusions P.

As a result, since the thin film transistor substrate 100 may have various electrical characteristics and a difference between the electrical characteristics of regions is reduced, the thin film transistor substrate 100 may achieve more uniform electrical characteristics over the entire substrate.

Turning now to the cross section of a thin film transistor 115 as illustrated in FIG. 2, after formation of the active layer 108, a gate insulating film 109 is formed on the active layer 108, and the first gate electrode 110 and the second gate electrode 111 are formed on predetermined portions of the gate insulating film 109. The first gate electrode 110 is formed to overlap the first channel region 103, and the second gate electrode 111 is formed to overlap the second channel region 104. The first gate electrode 110 and the second gate electrode 111 may be made out of various materials based on such design parameters as high adhesion with an adjacent layer, flatness, electrical resistance, processability, and the like.

An interlayer insulating film 112 is formed on the first gate electrode 110 and the second gate electrode 111. A source electrode 113 and a drain electrode 114 are formed on the interlayer insulating film 112, to respectively contact the source region 105 and the drain region 106 of the active layer 108. The source electrode 113 and the drain electrode 114 may be made out of various materials, such as gold (Au), palladium (Pd), platinum (Pt), nickel (Ni), rhodium (Rh), ruthenium (Ru), iridium (Ir), osmium (Os), aluminum (Al), or molybdenum (Mo), or an alloy such as Al:Md or Mo:W.

Figure 3:
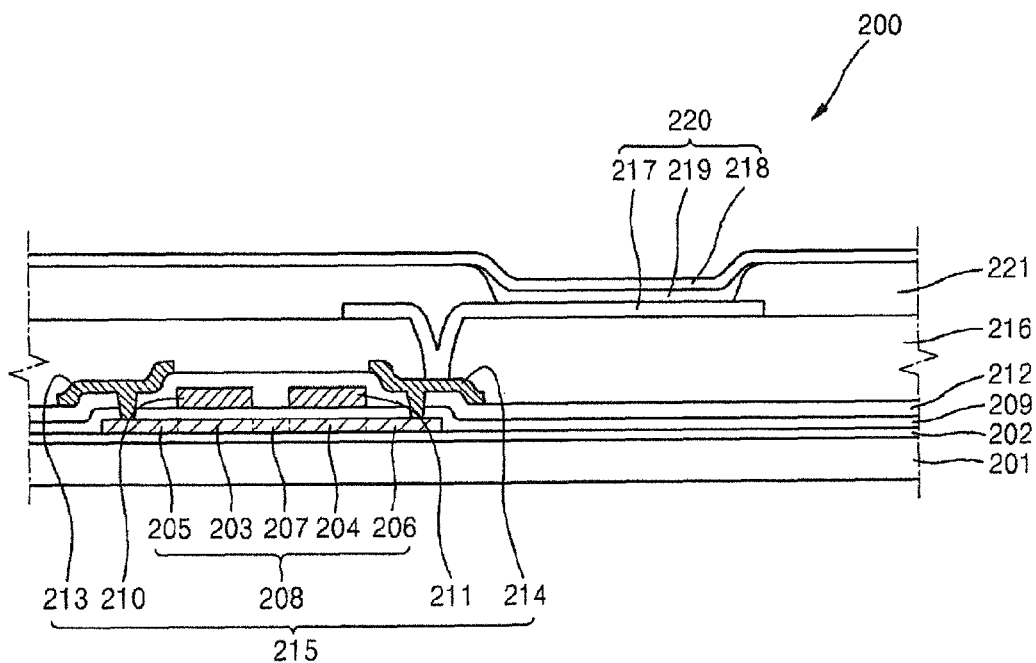
FIG. 3 is a cross-sectional view of a flat panel display apparatus according to another embodiment of the present invention.

Turning now to FIG. 3, FIG. 3 is a cross-sectional view of a flat panel display apparatus 200 according to another embodiment of the present invention. The flat panel display apparatus 200 of FIG. 3 may be any of various display apparatuses. Specifically, the flat panel display apparatus 200 may be an organic light-emitting display apparatus or a liquid crystal display apparatus. For convenience of explanation, the following description will be made on the assumption that the flat panel display apparatus 200 is an organic light-emitting display apparatus.

The flat panel display apparatus 200 includes a plurality of thin film transistors 215. Specifically, the flat panel display apparatus 200 may include one or more thin film transistors 215 formed in one sub-pixel. For convenience of explanation, only one thin film transistor 215 is illustrated in FIG. 3 and the following description will be made by focusing on a differences from the thin film transistor substrate 100 of FIGS. 1 and 2.

A buffer layer 202 may be formed on a top surface of a substrate 201. The thin film transistor 215 is formed on the buffer layer 202. The thin film transistor 215 includes a first gate electrode 210, a second gate electrode 211, a source electrode 213, and a drain electrode 214 and an active layer 208 that includes a first channel portion 203 and a second channel portion 204.

Specifically, the active layer 208 having a predetermined pattern is formed on the buffer layer 202. The active layer 208 is made out of crystalline silicon. Specifically, the active layer 208 is formed by crystallizing amorphous silicon by using SLS. Although not shown, a plurality of protrusion lines (not shown) which are linear are formed on a surface of the active layer 208 as shown in FIG. 1.

The active layer 208 includes the first channel region 203, the second channel region 204, a source region 205, a drain region 206, and an intermediate region 207. The first channel region 203 and the second channel region 204 are intrinsic regions into which conductive impurities are not doped. The source region 205, the drain region 206 and the intermediate region 207 include extrinsic regions into which conductive impurities are doped.

Although not shown, both edges (not shown) of the first channel region 203 are formed to be shifted sideways as compared to corresponding edges (not shown) of the second channel region 204 as in FIG. 1. Accordingly, the numbers of protrusion lines formed on surfaces of the first channel region 203 and the second channel region 204 may differ from each other. The flat panel display apparatus 200 of FIG. 3 includes at least one thin film transistor 215 including the first channel region 203 and the second channel region 204 on which a different number of protrusion lines are formed. A detailed explanation thereof is the same as that described above, and thus will not be given.

A gate insulating film 209 is formed on the active layer 208, and the first gate electrode 210 and the second gate electrode 211 are formed on predetermined portions of the gate insulating film 209. An interlayer insulating film 212 is formed on the first gate electrode 210 and the second gate electrode 211. The source electrode 213 and the drain electrode 214 are formed on the interlayer insulating film 212.

A passivation layer 216 is formed to cover the source electrode 213 and the drain electrode 214. The passivation layer 216 may be formed by using an inorganic insulating film and/or an organic insulating film. Examples of the inorganic insulating film may include $SiO_2$, $SiN_X$, SiON, $Al_2O_3$, $TiO_2$, $Ta_2O_5$, $HfO_2$, $ZrO_2$, barium strontium titanate (BST), and lead zirconate titanate (PZT), and examples of the organic insulating film may include a general-use polymer (e.g., polymethylmethacrylate (PMMA) or polystyrene (PS)), a polymer derivative having a phenol group, an acryl-based polymer, an imide-based polymer, an arylether-based polymer, an amide-based polymer, a fluorine-based polymer, a p-xylene-based polymer, a vinylalcohol-based polymer, and a blend thereof. The passivation layer 216 may instead be made out of a stack of inorganic insulating films and organic insulating films.

The passivation layer 216 is formed to expose the drain electrode 214, and an organic light-emitting device 220 is formed to be connected to the exposed drain electrode 214. The organic light-emitting device 220 includes a first electrode 217, a second electrode 218, and an intermediate layer 219. Specifically, the first electrode 217 and the drain electrode 214 are electrically connected to each other.

The intermediate layer 219 includes an organic light-emitting layer for emitting visible light, and emits visible light when a voltage is applied to the intermediate layer 219 through the first electrode 217 and the second electrode 218.

A pixel defining film 221 made out of an insulating material is formed on the first electrode 217. A predetermined opening is formed in the pixel defining film 221 to expose a portion of the first electrode 217. The intermediate layer 219 is formed on the exposed portion of the first electrode 217. The second electrode 218 is then formed on the intermediate layer 219.

A sealing member (not shown) may be disposed on the second electrode 218. The sealing member protects the intermediate layer 219 and other layers from external moisture or oxygen and is made out of a transparent material. To this end, the sealing member may be made out of glass, plastic, or a stack of an organic material and an inorganic material.

In the flat panel display apparatus 200 of FIG. 3, the number of protrusion lines formed on the first channel region 203 and the second channel region 204 within a single thin film transistor 215 may differ from each other by due to the first channel region 203 being shifted sideways with respect to the second channel region 204. As a result, the thin film transistors 215 of the flat panel display apparatus 200 may have uniform electrical characteristics, and the flat panel display apparatus 200 may provide uniform electrical characteristics over entire regions. Accordingly, since the flat panel display apparatus 200 provide uniform image quality characteristics over entire regions, the flat panel display apparatus 200 having excellent image quality may be easily manufactured.

Also, protrusion lines may change optical characteristics by diffusing or scattering light, which may affect the image quality of a flat panel display apparatus. The flat panel display apparatus 200 of FIG. 3 provides uniform optical characteristics over entire regions by allowing for variations in the numbers of protrusion lines formed on channel regions of thin film transistors, thereby improving image quality.

As described above, the thin film transistor substrate and the flat panel display apparatus according to the present invention may provide uniform electrical characteristics and uniform display characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor substrate comprising a plurality of thin film transistors, wherein each of the plurality of thin film transistors comprises:
    an active layer comprising a first channel region having a first plurality of protrusion lines arranged therein and a second channel region and having a second plurality of protrusion lines arranged therein;
    a source electrode and a drain electrode electrically connected to the active layer; and
    a gate electrode insulated from the active layer, wherein the first and second plurality of protrusion lines extend in a first direction, wherein a edges of the first channel region that extend in the first direction and are offset sideways by a distance in a second direction that is orthogonal to the first direction from corresponding edges of the second channel region that extend in the first direction.

2. The thin film transistor substrate of claim 1, wherein the first plurality is unequal to the second plurality.

3. The thin film transistor substrate of claim 1, wherein the first plurality differs from the second plurality by 1.

4. The thin film transistor substrate of claim 1, wherein the first channel region and the second channel region extend in the second direction.

5. The thin film transistor substrate of claim 1, wherein a length of the first channel region extending in the second direction is equal to a length of the second channel region extending in the second direction.

6. The thin film transistor substrate of claim 1, wherein neighboring ones of the first plurality of protrusion lines and neighboring ones of the second plurality of protrusion lines are spaced apart from each other at regular intervals.

7. The thin film transistor substrate of claim 1, wherein the active layer further comprises:
    an intermediate region arranged between the first channel region and the second channel region; and
    a source region and a drain region arranged on sides of the first channel region and the second channel region opposite from the intermediate region.

8. The thin film transistor substrate of claim 7, wherein both edges of the intermediate region extending from the first channel region to the second channel region form an oblique angle with the first direction.

9. The thin film transistor substrate of claim 1, wherein the gate electrode comprises:
    a first gate electrode overlapping the first channel region; and
    a second gate electrode overlapping the second channel region.

10. A flat panel display apparatus comprising a display device and a plurality of thin film transistors, each of the plurality of thin film transistors comprises:
    an active layer comprising a first channel region having a first plurality of protrusion lines arranged therein and a second channel region and having a second plurality of protrusion lines arranged therein;
    a source electrode and a drain electrode electrically connected to the active layer; and
    a gate electrode insulated from the active layer, wherein the first and second plurality of protrusion lines extend in a first direction, wherein edges of the first channel region that extend in the first direction and are offset sideways by a distance in a second direction that is orthogonal to the first direction from corresponding edges of the second channel region that extend in the first direction.

11. The flat panel display apparatus of claim 10, wherein the first plurality is unequal to the second plurality.

12. The flat panel display apparatus of claim 10, wherein the first plurality differs from the second plurality by 1.

13. The flat panel display apparatus of claim 10, wherein the first channel region and the second channel region extend in the second direction.

14. The flat panel display apparatus of claim 10, wherein a length of the first channel region extending in the second direction is equal to a length of the second channel region extending in the second direction.

15. The flat panel display apparatus of claim 10, wherein neighboring ones of the first plurality of protrusion lines and neighboring ones of the second plurality of protrusion lines are spaced apart from each other at regular intervals.

16. The flat panel display apparatus of claim 10, wherein the active layer further comprises:
   an intermediate region arranged between the first channel region and the second channel region; and
   a source region and a drain region arranged on sides of the first channel region and the second channel region that are opposite from the intermediate region.

17. The flat panel display apparatus of claim 16, wherein both edges of the intermediate region extending from the first channel region to the second channel region form an oblique angle with the first direction.

18. The flat panel display apparatus of claim 10, wherein the gate electrode comprises:
   a first gate electrode overlapping the first channel region; and
   a second gate electrode overlapping the second channel region.

19. The flat panel display apparatus of claim 10, wherein the display device is selected from a group consisting of an organic light-emitting diode display device and a liquid crystal display device.

20. The flat panel display apparatus of claim 10, wherein the display device is electrically connected to at least one of the plurality of thin film transistors.

* * * * *